United States Patent [19]
Bosnyak et al.

[11] Patent Number: 5,898,297
[45] Date of Patent: Apr. 27, 1999

[54] DIFFERENTIAL HIGH SPEED DRIVER FOR LOW VOLTAGE OPERATION

[75] Inventors: Robert J. Bosnyak, San Jose; Robert J. Drost, Palo Alto, both of Calif.

[73] Assignee: Sun Microsystems, Inc., Palo Alto, Calif.

[21] Appl. No.: 08/828,243

[22] Filed: Mar. 31, 1997

[51] Int. Cl.[6] .................................................. G05F 3/16
[52] U.S. Cl. ........................................... 323/315; 327/108
[58] Field of Search ..................................... 323/315, 316; 327/108, 543

[56] References Cited

U.S. PATENT DOCUMENTS

| | | | |
|---|---|---|---|
| 5,446,412 | 8/1995 | Kimyacioglu et al. | 330/285 |
| 5,451,861 | 9/1995 | Giebel | 323/315 |
| 5,479,091 | 12/1995 | Chloupek | 323/315 |
| 5,550,464 | 8/1996 | Lorenz | 323/315 |
| 5,703,519 | 12/1997 | Crook et al. | 327/387 |
| 5,767,698 | 6/1998 | Emeigh et al. | 326/83 |

OTHER PUBLICATIONS

Kyongho Lee et al., "A CMOS Serial Link for 1 Gbaud Fully Duplexed Data Communication," 1994 Symposium on VLSI Circuits Digest of Technical Papers, pp. 125–126.
Niantsu Wang, "Digital MOS Integrated Circuits," Prentice Hall (1989), pp. 156–157.
U.S. Application Serial No. 08/653,788, filed May 28, 1996, entitled "Fully Complimentary Differential Output Driver For High Speed Digital Communications" by Robert J. Bosnyak et al. (Copy not enclosed).

*Primary Examiner*—Stuart N. Hecker
*Attorney, Agent, or Firm*—Skjerven, Morrill, MacPherson, Franklin & Friel, L.L.P.

[57] ABSTRACT

A driver includes first and second input terminals for receiving first and second input voltages, respectively, of a differential input signal, first and second switches coupled to the first and second input terminals, respectively, third and fourth switches coupled to the first and second input terminals, respectively, first, second, third and fourth current references coupled to the first, second, third and fourth switches, respectively, first second, third and fourth current mirrors coupled to the first, second, third and fourth current references, respectively, a first output terminal coupled to the first and third current mirrors, and a second output terminal coupled to the second and fourth current mirrors. When the first input voltage is less than the second input voltage, a first output current generated by the first and fourth current mirrors flows in a first direction between the output terminals, and when the first input voltage is greater than the second input voltage, a second output current generated by the second and third current mirrors flows in a second direction between the output terminals.

35 Claims, 3 Drawing Sheets

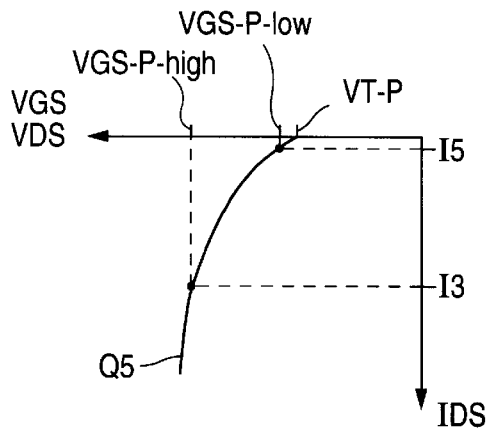
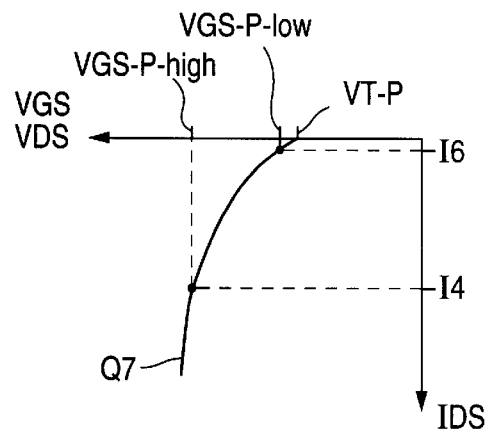
FIG. 2A  FIG. 2B
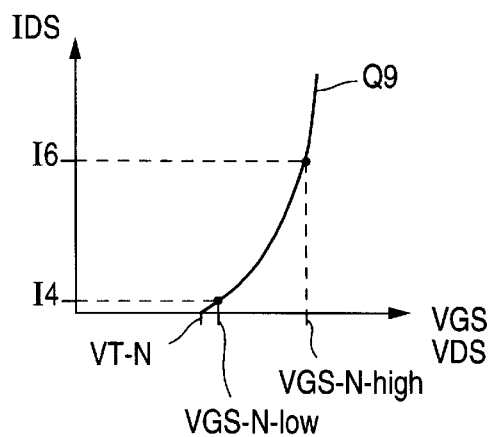
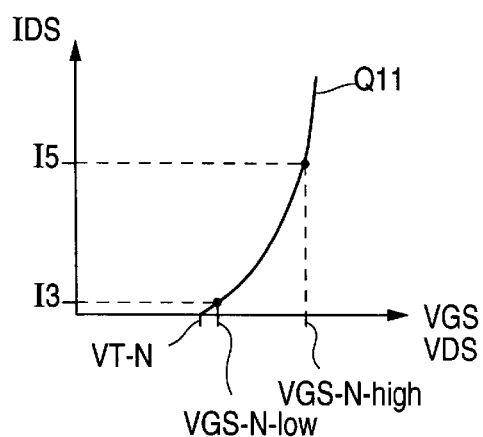
FIG. 2C  FIG. 2D

DIFFERENTIAL HIGH SPEED DRIVER FOR LOW VOLTAGE OPERATION

BACKGROUND OF THE INVENTION

1. Field of the Invention

The present invention relates to drivers, and more particularly to high speed differential drivers for providing bi-directional output currents in response to differential input signals.

2. Description of Related Art

Differential drivers are used for driving cables interconnecting integrated circuits, peripheral devices, traces, and so on. The driver receives a differential input signal that includes a first voltage representing a logic state and a second voltage representing the complement of the logic state. For instance, when the logic state is a "1" the first voltage is high and the second voltage is low, and when the logic state is a "0" the first voltage is low and the second voltage is high. The driver generates an output current in response to the differential input signal. When the first voltage is high and the second voltage is low the output current flows in a first direction, and when the first voltage is low and the second voltage is high the output current flows in a second direction opposite the first direction. Typically the output current has the same magnitude in both directions.

Differential drivers are implemented with bipolar and CMOS technology. CMOS drivers are described by Kyongho Lee et al in "A CMOS Serial Link for 1 Gbaud Fully Duplexed Data Communication," 1994 Symposium on VLSI Circuits Digest of Technical Papers, pp. 125–126, and by Niantsu Wang in "Digital MOS Integrated Circuits," Prentice Hall (1989), pp. 156–157.

Unfortunately, like their bipolar counterparts, these CMOS drivers dissipate a considerable amount of power via steady state current which does not contribute to the output signal. For instance, the CMOS driver described by Wang includes two current sources coupled to the supply voltage and two switching transistors coupled to ground. The switching transistors are responsive to the differential input signal. A first output terminal is coupled to the first current source and the first switching transistor, and a second output terminal is coupled to the second current source and the second switching transistor. When the differential signal causes the first switching transistor to open and the second switching transistor to close, the current from the first current source flows from the first output terminal through a load to the second output terminal and through the second switching transistor to ground, however, the current from the second current source flows through the second switching transistor to ground and is wasted. Likewise, when the differential signal causes the first switching transistor to close and the second switching transistor to open, the current from the second current source flows from the second output terminal through the load to the first output terminal and through the first switching transistor to ground, however, the current from the first current source flows through the first switching transistor to ground and is wasted.

A driver that essentially eliminates wasted current is described by Robert J. Bosnyak et al in U.S. application Ser. No. 08/653,788 filed May 28, 1996, entitled "Fully Complimentary Differential Output Driver For High Speed Digital Communications." In one embodiment, the driver includes a first current source coupled to the supply voltage, a second current source coupled to ground, first and second switching transistors coupled to the first current sources, third and fourth transistors coupled to the second current source, a first output terminal between the first and third switching transistors, and a second output terminal between the second and fourth switching transistors. When the differential signal causes the first and third switching transistors to close and the second and fourth switching transistors to open, the current from the first current source flows through the first switching transistor to the first output terminal, from the first output terminal through a load to the second output terminal, and from the second output terminal through the third switching transistor to the second current source to ground. Likewise, when the differential signal causes the first and third switching transistors to open and the second and fourth switching transistors to close, the current from the first current source flows through the second switching transistor to the second output terminal, from the second output terminal through the load to the first output terminal, and from the first output terminal through the fourth switching transistor to the second current source to ground. In this manner, a constant current between the first and second current sources is steered in alternating directions through the load. A drawback, however, is that the power supply voltage must normally exceed the combined threshold voltages of four transistors (two current sources and two switching transistors) in order to keep these transistors in saturation.

It is often desirable to reduce the power supply voltage, for instance from 5 volts to 2–3 volts, for several reasons. First, this reduces power dissipation, which can be of great importance in portable electronics such as laptop computers and cellular telephones. Second, this increases reliability. That is, as MOS transistor dimensions are reduced, the electric field in the channel region near the drain tends to increase. If the electric field becomes strong enough, it can give rise to so-called hot-carrier effects, in which hot electrons overcome the potential energy barrier between the substrate and the gate insulator and are injected into the gate insulator. Trapped charge in the gate insulator can accumulate over time and lead to a permanent change in the threshold voltage of the device, which can cause the device to turn on and off at the wrong voltage levels.

In CMOS circuits, the power supply voltage normally exceeds the combined threshold voltages of the N-channel and P-channel devices to assure that N-channel and P-channel devices connected in series between the power supply terminals can be driven into saturation. Thus, CMOS circuits that require power supply voltages on the order of four threshold voltages are not well-suited for low voltage operation.

Accordingly, a need exists for a CMOS differential driver that reduces power dissipation yet operates at low voltages.

SUMMARY OF THE INVENTION

A differential driver is disclosed herein which fulfills the need in the art described above.

In accordance with one aspect of the invention, a driver includes first and second input terminals for receiving first and second input voltages, respectively, first and second switches coupled to the first and second input terminals, respectively, third and fourth switches coupled to the first and second input terminals, respectively, first, second, third and fourth current references coupled to the first, second, third and fourth switches, respectively, first, second, third and fourth current mirrors coupled to the first, second, third and fourth current references, respectively, a first output terminal coupled to the first and third current mirrors, and a second output terminal coupled to the second and fourth current mirrors.

A method of operating the driver includes applying the first input voltage to the first and third switches and applying the second input voltage to the second and fourth switches, using the first and fourth switches to establish a first reference current between the first and fourth current references when the first input voltage is less than the second input voltage, using the first and fourth current mirrors to drive a first output current in a first direction between the first and second output terminals and through a load in response to the first reference current, using the second and third switches to establish a second reference current between the second and third current references when the first input voltage is greater than the second input voltage, and using the second and third current mirrors to drive a second output current in a second direction, opposite the first direction, between the first and second output terminals and through the load in response to the second reference current.

Advantageously, the first and second output currents have far greater magnitudes than the first and second reference currents. As a result, substantially all current that flows through the driver flows between the first and second output terminals through the load. Moreover, since the first, second, third and fourth switches can be implemented by transistors operating in the linear region, the power supply voltage for the driver need only slightly exceed the combined threshold voltages of an N-channel and P-channel device.

These and other objects, features and advantages of the invention will be further described and more readily apparent from a review of the detailed description of the preferred embodiments which follow.

BRIEF DESCRIPTION OF THE DRAWINGS

FIGS. 2A–2D illustrate the current-voltage characteristics of current references in the driver of FIG. 1.

DETAILED DESCRIPTION OF THE PREFERRED EMBODIMENTS

Figure 1:
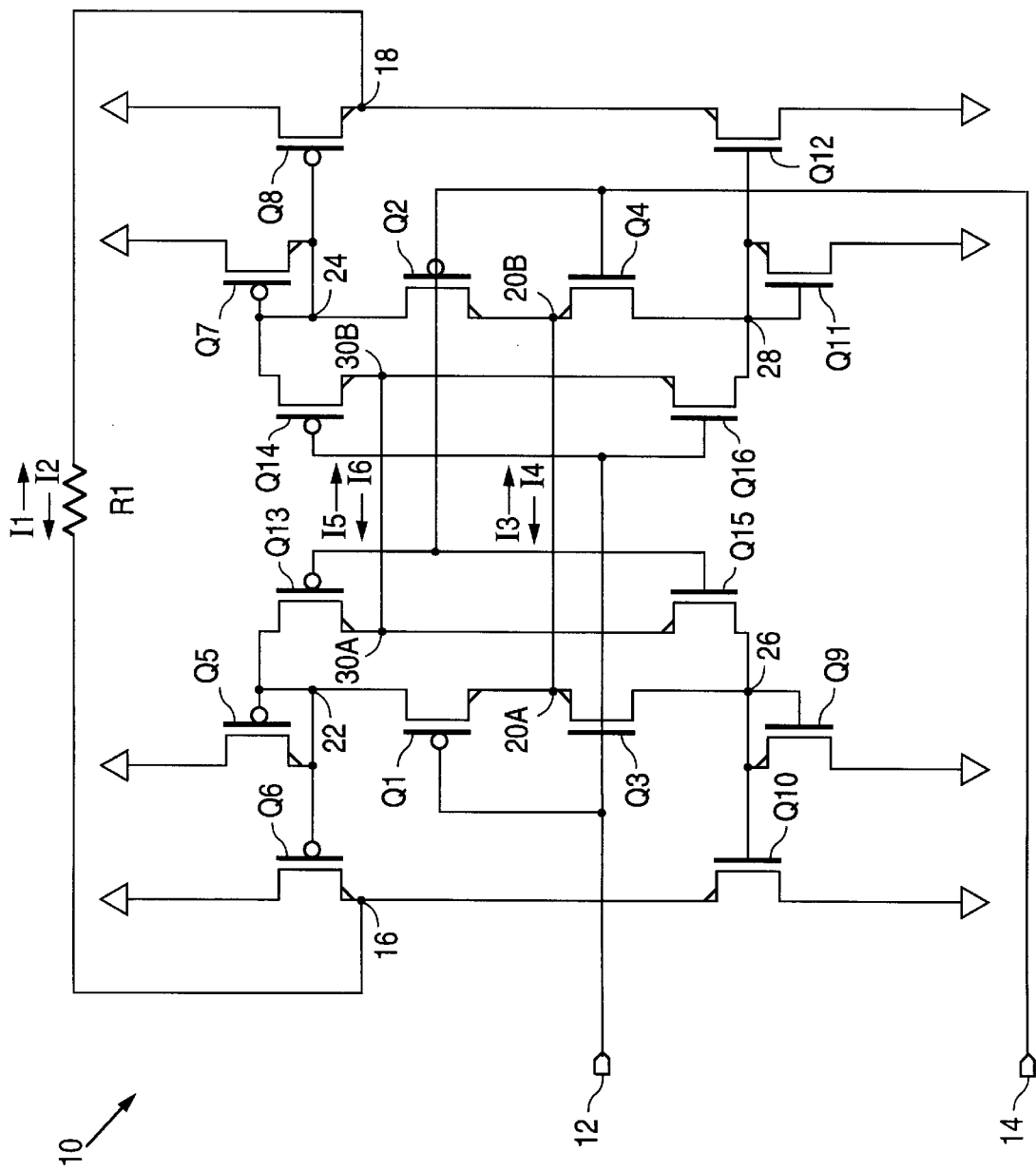
FIG. 1 illustrates a schematic diagram for a differential driver in accordance with an embodiment of the present invention.

FIG. 1 illustrates a schematic diagram for a differential driver 10 in accordance with an embodiment of the present invention. Driver 10 receives a differential input signal consisting of input voltages V12 and V14 at input terminals 12 and 14, respectively, and generates an output current between output terminals 16 and 18 that flows through load R1. Voltages V12 and V14 represent a logic state and its complement, respectively. That is, when the logic state is a "1" voltage V12 is high (at VDD, the power supply voltage) and voltage V14 is low (at ground), and when the logic state is a "0" voltage V12 is low and voltage V14 is high. Driver 10 generates the output current in response to the differential input signal. When voltage V12 is low and voltage V14 is high then output current I1 flows from output terminal 16 through load R1 into output terminal 18, and when voltage V12 is high and voltage V14 is low then output current I2 flows from output terminal 18 through load R1 into output terminal 16. Thus, driver 10 provides a bi-directional output current with the direction controlled by the differential input signal.

Driver 10 includes a first differential stage provided by transistors Q1 and Q2, and a second differential stage provided by transistors Q3 and Q4. Transistors Q1 and Q3 are coupled to input terminal 12, and transistors Q2 and Q4 are coupled to input terminal 14. Driver 10 also includes a first current reference provided by diode-connected transistor Q5 coupled to a first current mirror provided by transistor Q6, a second current reference provided by diode-connected transistor Q7 coupled to a second current mirror provided by transistor Q8, a third current reference provided by diode-connected transistor Q9 coupled to a third current mirror provided by transistor Q10, and a fourth current reference provided by diode-connected transistor Q11 coupled to a fourth current mirror provided by transistor Q12.

Transistors Q6 and Q10 are coupled to output terminal 16, and transistors Q8 and Q12 are coupled to output terminal 18. Transistors Q5, Q6, Q7 and Q8 are coupled to a first power supply terminal at voltage VDD, and transistors Q9, Q10, Q11 and Q12 are coupled to a second power supply terminal at ground. Furthermore, transistors Q1, Q2, Q3 and Q4 are coupled to node 20 (shown as nodes 20A and 20B), transistors Q1, Q5 and Q6 are coupled to node 22, transistors Q2, Q7 and Q8 are coupled to node 24, transistors Q3, Q9 and Q10 are coupled to node 26, and transistors Q4, Q11 and Q12 are coupled to node 28.

In operation, transistors Q1 and Q4 switch in phase with one another and 180 degrees out of phase with transistors Q2 and Q3 to effect an alternating current flow through load R1. When the logic state is a "0" such that voltage V12 is low and voltage V14 is high, transistors Q1 and Q4 turn on and transistors Q2 and Q3 turn off. As a result, transistors Q1 and Q4 provide a connection path between transistors Q5 and Q11, and reference current I3 flows from transistor Q5 through transistor Q1 to node 20A, to node 20B, to transistor Q4, and through transistor Q11 to ground. In addition, voltage V22 at node 22 is pulled towards ground, and voltage V28 at node 28 is pulled towards VDD. This drives transistors Q6 and Q12 into saturation as they mirror the current through transistors Q5 and Q11, respectively. Therefore, output current I1 flows from transistor Q6 through output terminal 16 to load R1 to output terminal 18 and through transistor Q12 to ground.

In a similar manner, when the logic state is a "1" such that voltage V12 is high and voltage V14 is low, transistors Q2 and Q3 turn on and transistors Q1 and Q4 turn off. As a result, transistors Q2 and Q3 provide a connection path between transistors Q7 and Q9, and reference current I4 flows from transistor Q7 through transistor Q2 to node 20B, to node 20A, to transistor Q3, and through transistor Q9 to ground. In addition, voltage V24 at node 24 is pulled towards ground, and voltage V26 at node 26 is pulled towards VDD. This drives transistors Q8 and Q10 into saturation as they mirror the current through transistors Q7 and Q9, respectively. Therefore, output current I2 flows from transistor Q8 through output terminal 18 to load R1 to output terminal 16 and through transistor Q10 to ground.

Output currents I1 and I2 have the same magnitude and flow in opposite directions between output terminals 16 and 18. Likewise, reference currents I3 and I4 have the same magnitude and flow in opposite directions between nodes 20A and 20B. Furthermore, output currents I1 and I2 have far larger magnitudes than reference currents I3 and I4. To provide these magnitudes, transistors Q1 and Q2 are matched in size, transistors Q3 and Q4 are matched in size, transistors Q5 and Q7 are matched in size, transistors Q6 and Q8 are matched in size, transistors Q9 and Q11 are matched in size, and transistors Q10 and Q12 are matched in size. Accordingly, the ratio of channel widths between transistors Q5 and Q6, Q7 and Q8, Q9 and Q10, Q11 and Q12 is a constant scaling factor. For instance, a scaling factor of 12 can be used so that output currents I1 and I2 are about 12 times larger than reference currents I3 and I4.

When voltage V12 is high and voltage V14 is low, transistors Q1 and Q4 turn off and fail to provide current at nodes 22 and 28. In the absence of another current source for nodes 22 and 28, when voltage V12 transitions low and voltage V14 transitions high there will be a delay associated with charging nodes 22 and 28 are transistors Q1 and Q4 turn on. Likewise, when voltage V12 is low and voltage V14 is high, transistors Q2 and Q3 turn off and fail to provide current at nodes 24 and 26. In the absence of another current source at nodes 24 and 26, when voltage V12 transitions high and voltage V14 transitions low there will be a delay associated with charging nodes 24 and 26 as transistors Q2 and Q3 turn on.

Driver 10 includes a first bias circuit provided by transistors Q13 and Q16, and a second bias circuit provided by transistors Q14 and Q15, in order to reduce these delays. Transistors Q13 and Q14 are configured as a first differential stage, and transistors Q15 and Q16 are configured as a second differential stage. Transistors Q14 and Q16 are coupled to input terminal 12, and transistors Q13 and Q15 are coupled to input terminal 14. Transistors Q13, Q14, Q15 and Q16 are coupled to nodes 22, 24, 26 and 28, respectively. Furthermore, transistors Q13, Q14, Q15 and Q16 are coupled to node 30 (shown as nodes 30A and 30B).

In operation, transistors Q13 and Q16 switch in phase with one another and 180 degrees out of phase with transistors Q14 and Q15. In addition, transistors Q13 and Q16 switch in phase with transistors Q2 and Q3, and transistors Q14 and Q15 switch in phase with transistors Q1 and Q4. When the logic state is a "1" such that voltage V12 is high and voltage V14 is low, transistors Q1 and Q4 turn off, transistors Q2 and Q3 turn on, and driver 10 generates output current I2. At this time, transistors Q13 and Q16 provide a small bias current I5 at nodes 22 and 28. That is, transistors Q13 and Q16 provide a connection path between transistors Q5 and Q11, and bias current I5 flows from transistor Q5 through Q13 to node 30A, to node 30B, to transistor Q16, and through transistor Q11 to ground. Bias current I5 biases node 22 below VDD by about the threshold voltage of transistors Q5 and Q6, and bias current I5 biases node 28 above ground by about the threshold voltage of transistors Q11 and Q12. As a result, bias current I5 operates transistors Q5 Q6, Q11 and Q12 in the weakly on and saturated region near the off state.

Similarly, when the logic state is a "0" such that voltage V14 is high and voltage V12 is low, transistors Q2 and Q3 turn off, transistors Q1 and Q4 turn on, and driver 10 generates output current I1. At this time, transistors Q14 and Q15 provide a small bias current I6 at nodes 24 and 26. That is, transistors Q14 and Q15 provide a connection path between transistors Q7 and Q9, and bias current I6 flows from transistor Q7 through transistor Q14 to node 30B, to node 30A, to transistor Q15, and through transistor Q9 to ground. Bias current I6 biases node 24 below VDD by about the threshold voltage of transistors Q7 and Q8, and bias current I6 biases node 26 above ground by about the threshold voltage of transistors Q9 and Q10. As a result, bias current I6 operates transistors Q7, Q8, Q9 and Q10 in the weakly on and saturated region near the off state.

Bias currents I5 and I6 have the same magnitude and flow in opposite directions between nodes 30A and 30B. Furthermore, bias currents I5 and I6 have a far smaller magnitude (for instance, 1/10th) than reference currents I3 and I4. To provide these magnitudes, transistors Q13 and Q14 are matched in size, transistors Q15 and Q16 are matched in size, and transistors Q13, Q14, Q15 and Q16 have far smaller channel widths and far larger channel lengths than transistors Q1, Q2, Q3 and Q4.

FIGS. 2A–2D illustrates the current-voltage characteristics of transistors Q5, Q7, Q9 and Q11, respectively, during the operation of driver 10. As mentioned above, transistors Q5, Q7, Q9 and Q11 are diode-connected current references. When voltage V12 is greater than voltage V14, transistors Q2 and Q3 transfer reference current I4 between transistors Q7 and Q9, and transistors Q13 and Q16 transfer bias current I5 between transistors Q5 and Q11. Likewise, when voltage V14 is greater than voltage V12, transistors Q1 and Q4 transfer reference current I3 between transistors Q5 and Q11, and transistors Q14 and Q15 transfer bias current I6 between transistors Q7 and Q9. Accordingly, voltage V22 at node 22 adjusts to bias transistor Q5, voltage V24 at node 24 adjusts to bias transistor Q7, voltage V26 at node 26 adjusts to bias transistor Q9, and voltage V28 at node 28 adjusts to bias transistor Q11. Transistors Q5 and Q7 (P-channel devices) have a threshold voltage VT-P, and a gate-to-source voltage that toggles between VGS-P-low and VGS-P-high. Similarly, transistors Q9 and Q11 (N-channel devices) have a threshold voltage VT-N, and a gate-to-source voltage that toggles between VGS-N-low and VGS-N-high.

Figure 3A:
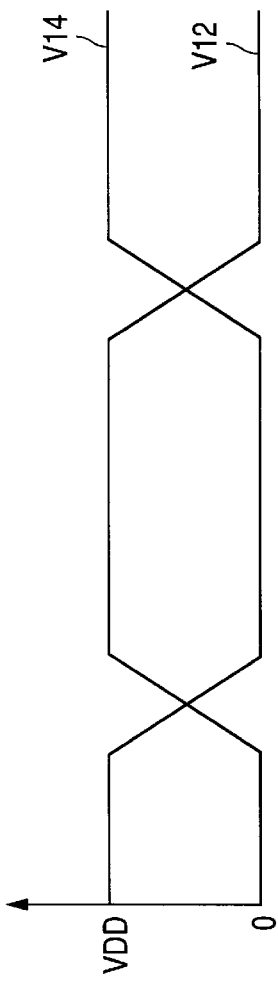
FIG. 3 illustrates waveforms generated during the operation of the driver of FIG. 1.
Figure 3B:
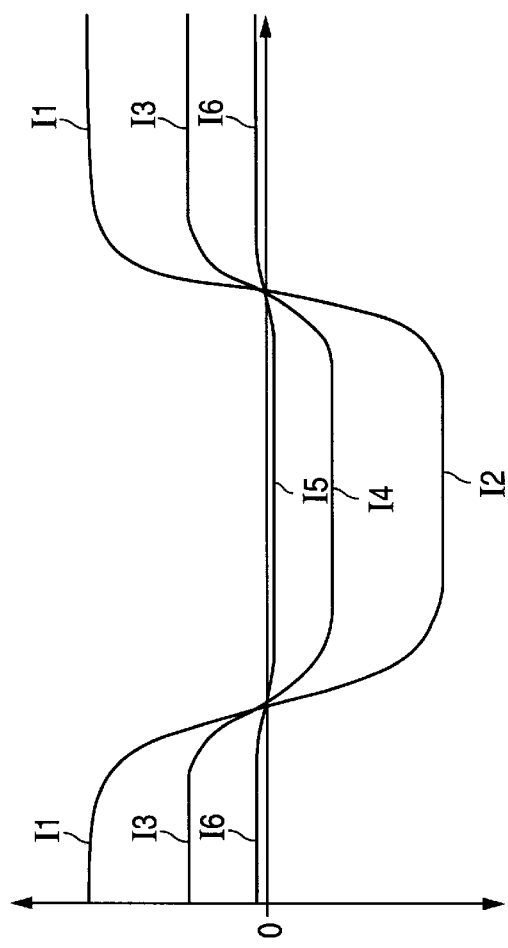
Figure 3C:
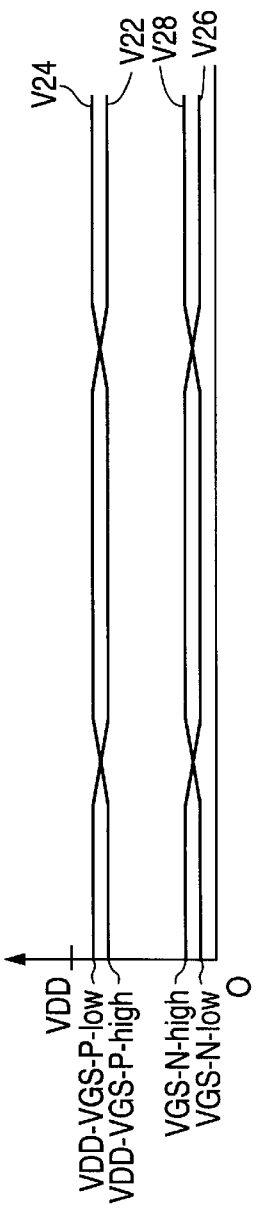

FIG. 3 illustrates waveforms generated during the operation of driver 10. As is seen, input voltages V12 and V14 are true differential waveforms that cross each other at the 50% point (VDD/2). Output currents I1 and I2, reference currents I3 and I4, and bias currents I5 and I6 are also true differential waveforms that cross each other at the 50% point (zero current) and switch in a smooth and overlapping manner. Voltages V22 and V24 toggle between (VDD–VGS-P-low) and (VDD–VGS-P-high), and voltages V26 and V28 toggle between VGS-N-low and VGS-N-high. There is a slight delay between the transitions of input voltages V12 and V14 and output currents I1 and I2, although this delay is reduced considerably by the biasing circuits. The rise and fall times of the waveforms are about 200 picoseconds.

Several advantages of driver 10 will be understood.

First, the vast majority (over 90%) of the current that flows between the power supply terminals through driver 10 is routed between the output terminals through the load. That is, output currents I1 and I2 are over an order of magnitude greater than reference currents I3 and I4 and are over two orders of magnitude greater than bias currents I5 and I6.

Second, the power supply voltage need only slightly exceed the threshold voltages of a complementary transistor pair (such as Q6 and Q12) in order for driver 10 to operate. It is critical to note that transistors Q1, Q2, Q3, Q4, Q13, Q14, Q15 and Q16 can be operated in the linear region, and need not operate in the saturation region. As a result, only a very small voltage drop need occur across the output terminals of these transistors when they turn on. For example, if VGS-P-low is 0.9 volts, VGS-P-high is 1.1 volts, VGS-N-low is 0.7 volts, VGS-N-high is 0.9 volts, and the drain-to-source voltage (VDS) of the transistors operated in the linear region is 0.1 to 0.2 volts, then the power supply voltage (VDD) need only exceed the combined threshold voltages of transistors Q2 and Q7 (1.6 volts) by about 0.6 to 0.8 volts. Of course, these values are highly dependent on the manufacturing process. With advanced processes, driver 10 can be fabricated to operate using a power supply voltage on the order of 1 to 2 volts.

Third, the optional bias circuits improve the response time while drawing very little current.

Fourth, the voltage at the output terminals is symmetric about VV/2 and does not reach the rails at VDD and ground due to the VDS drops across a transistor pair (Q6 and Q10 or Q8 and Q12) driving the output current. Therefore, if the output terminals are exposed to noise coupling, reflections, or other hostile signals, the danger of these signals creating recovery currents through PN junctions that lead to latch-up or delays is reduced.

Fifth, transistors Q6, Q8, Q10 and Q12 provide ESD protection at the output terminals. For instance, if a positive voltage spike is applied to output terminal 16, the PN junction formed by the P-type drain and the N-type well for transistor Q6 will route this spike to the power supply terminal at VDD coupled to the N-type well. Likewise, if a negative voltage spike is applied to output terminal 16, the PN junction formed by the N-type drain and the P-type well for transistor Q10 will route this spike to the power supply terminal at ground coupled to the P-type well. Transistors Q8 and Q12 provide similar ESD protection for output terminal 18.

Driver 10 is well-suited for driving a load that includes first and second matched transmission lines coupled at first ends to output terminals 16 and 18, respectively, and first and second resistive elements coupled to second ends of the first and second transmission lines, respectively. Typical transmission lines have a characteristic impedance on the order of 50 to 75 ohms, and typical resistive elements are chosen to match the characteristic impedance to reduce reflections on the lines.

It is understood that output currents I1 and I2 need not necessarily have the same magnitude. For instance, output currents I1 and/or I2 can be set by a reference voltage to adjust the average DC output levels of driver 10 according to the operating characteristics of a receiver circuit (not shown) coupled to output terminals 16 and 18.

If desired, a resistive element (rather than a wire) can be connected between nodes 20A and 20B and/or between nodes 30A and 30B to provide further control over the magnitudes of the reference currents and bias currents, respectively. Such a resistive element renders the size of the transistors coupled to the resistive element less critical in determining the current through the resistive element. Suitable resistive elements include tub resistors, doped polysilicon resistors, and nichrome resistors.

Although driver 10 employs CMOS transistors as the switching devices and diodes, any suitable switching devices and diodes may be used. Driver 10 is particularly well-suited for use in an integrated circuit chip in a computer system.

Other variations and modifications of the embodiments disclosed herein may be made based on the description set forth herein without departing from the scope and spirit of the invention as set forth in the following claims.

What is claimed is:

1. An apparatus including a driver, the driver comprising:
   first and second input terminals for receiving first and second input voltages, respectively, of a differential input signal;
   first and second switches coupled to the first and second input terminals, respectively;
   third and fourth switches coupled to the first and second input terminals, respectively;
   first, second, third and fourth current references coupled to the first, second, third and fourth switches, respectively;
   first, second, third and fourth current mirrors coupled to the first, second, third and fourth current references, respectively; and
   first and second output terminals, the first output terminal coupled to the first and third current mirrors, the second output terminal coupled to the second and fourth current mirrors.

2. The apparatus of claim 1, wherein:
   the first and fourth switches activate the first and fourth current references, respectively, which activate the first and fourth current mirrors, respectively, to supply a first output current in a first direction between the first and second output terminal through a load when the first input voltage is less than the second input voltage; and
   the second and third switches activate the second and third current references, respectively, which activate the second and third current mirrors, respectively, to supply a second output current, in a second direction opposite the first direction, between the first and second output terminals through the load when the first input voltage is greater than the second input voltage.

3. The apparatus of claim 2, wherein the first and second currents have the same magnitude.

4. The apparatus of claim 3, wherein substantially all current that flows through the driver flows between the first and second output terminals through the load.

5. The apparatus of claim 1, wherein:
   the first and second current references are coupled to a first power supply terminal; and
   the third and fourth current references are coupled to a second power supply terminal.

6. The apparatus of claim 5, wherein a load includes first and second matched transmission lines coupled to the first and second output terminals, respectively.

7. The apparatus of claim 5, wherein substantially all current that flows between the first and second power supply terminals through the driver also flows between the first and second output terminals through a load.

8. The apparatus of claim 5, wherein:
   the first switch includes a first transistor with a control terminal coupled to the first input terminal;
   the second switch includes a second transistor with a control terminal coupled to the second input terminal;
   the third switch includes a third transistor with a control terminal coupled to the first input terminal;
   the fourth switch includes a fourth transistor with a control terminal coupled to the second input terminal; and
   first, second, third and fourth transistors are coupled to one another.

9. The apparatus of claim 8, wherein:
   the first and fourth transistors are operated in the linear region and the second and third transistors are off when the first input voltage is less than the second input voltage; and
   the second and third transistors are operated in the linear region and the first and fourth transistors are off when the first input voltage is greater than the second input voltage.

10. The apparatus of claim 8, wherein the first and second transistors are complementary to the third and fourth transistors.

11. The apparatus of claim 10, wherein:
    the first transistor is coupled to the first current reference and the first current mirror at a first node;

the second transistor is coupled to the second current reference and the second current mirror at a second node;

the third transistor is coupled to the third current reference and the third current mirror at a third node; and the fourth transistor is coupled to the fourth current reference and the fourth current mirror at a fourth node.

12. The apparatus of claim 11, further including:

a first bias circuit for providing a first bias current between the first and fourth nodes when the first and fourth transistors are off; and a second bias circuit for providing a second bias current between the second and third nodes when the second and third transistors are off.

13. The apparatus of claim 12, wherein the first and second bias circuits include:

a thirteenth transistor with a control terminal coupled to the second input terminal, with an output terminal coupled to the first node, and with another output terminal coupled to a fifth node;

a fourteenth transistor with a control terminal coupled to the first input terminal, with an output terminal coupled to the second node, and with another output terminal coupled to the fifth node;

a fifteenth transistor with a control terminal coupled to the second input terminal, with an output terminal coupled to the third node, and with another output terminal coupled to the fifth node; and a sixteenth transistor with a control terminal coupled to the first input terminal, with an output terminal coupled to the fourth node, and with another output terminal coupled to the fifth node.

14. The apparatus of claim 11, wherein:

the first current reference includes a fifth transistor with a control terminal and an output terminal coupled to the first node and with another output terminal coupled to the first power supply terminal;

the second current reference includes a sixth transistor with a control terminal and an output terminal coupled to the second node and with another output terminal coupled to the first power supply terminal;

the third current reference includes a seventh transistor with a control terminal and an output terminal coupled to the third node and with another output terminal coupled to the second power supply terminal;

the fourth current reference includes an eighth transistor with a control terminal and an output terminal coupled to the fourth node and with another output terminal coupled to the second power supply terminal.

15. The apparatus of claim 14, wherein:

the first current mirror includes a ninth transistor with a control terminal coupled to the first node, with an output terminal coupled to the first output terminal, and with another output terminal coupled to the first power supply terminal;

the second current mirror includes a tenth transistor with a control terminal coupled to the second node, with an output terminal coupled to the second output terminal, and with another output terminal coupled to the first power supply terminal;

the third current mirror includes an eleventh transistor with a control terminal coupled to the third node, with an output terminal coupled to the first output terminal, and with another output terminal coupled to the second power supply terminal;

the fourth current mirror includes a twelfth transistor with a control terminal coupled to the fourth node, with an output terminal coupled to the second output terminal, and with another output terminal coupled to the second power supply terminal.

16. The apparatus of claim 15, wherein a ratio of channel widths of the fifth and ninth transistors, of the sixth and tenth transistors, of the seventh and eleventh transistors, and of the eighth and twelfth transistors are matched.

17. The apparatus of claim 15, wherein the fifth, sixth, seventh and eight transistors are matched in size, and the ninth, tenth, eleventh and twelfth transistors are matched in size.

18. The apparatus of claim 15, wherein the first, second, fifth, sixth, ninth and tenth transistors are complementary to the third, fourth, seventh, eight, eleventh and twelfth transistors.

19. The apparatus of claim 1, further including an integrated circuit chip that includes the driver.

20. The apparatus of claim 19, further including a computer system that includes the integrated circuit chip.

21. A driver comprising:

first and second differential stages each for receiving first and second input voltages of a differential input signal, wherein the first and second differential stages establish a first reference current when the first input voltage is a first voltage level and the second input voltage is a second voltage level, and the first and second differential stages establish a second reference current when the first input voltage is the second voltage level and the second input voltage is the first voltage level;

a first pair of current mirrors, responsive to the first reference current, for establishing an output current in a first direction through a load; and a second pair of current mirrors, responsive to the second reference current, for establishing the output current in a second direction, opposite the first direction, through the load.

22. The driver of claim 21, wherein the first and second reference currents flow in opposite directions through a node.

23. The driver of claim 21, including:

a first bias circuit for generating a first bias current to bias the first pair of current mirrors when the second reference current is established; and a second bias circuit for generating a second bias current to bias the second pair of current mirrors when the first reference current is established.

24. The driver of claim 21, wherein substantially all of the current that flows through the driver circuit flows through the load.

25. The driver of claim 21, wherein the driver is operational when a power supply voltage for the driver is slightly greater than a combination of threshold voltages for a single N-channel transistor and a single P-channel transistor in the driver.

26. A method of operating a driver, comprising the steps of:

applying a first and second input voltages of a differential input signal to control terminals of first and second switches, respectively;

applying the first and second input voltages to control terminals of third and fourth switches, respectively;

using the first and fourth switches to establish a first reference current when the first input voltage is less than the second input voltage;

using first and fourth current mirrors to drive a first output current between first and second output terminals and through a load in response to the first reference current;

using the second and third switches to establish a second reference current when the first input voltage is greater than the second input voltage; and using second and third current mirrors to drive a second output current between the first and second output terminals and through the load in response to the second reference current.

27. The method of claim 26, wherein:

the first and second reference currents have the same magnitude and flow in opposite directions through a node, and the first and second output currents have the same magnitude and flow in opposite directions through the load.

28. The method of claim 26, wherein:

the first and second current mirrors are coupled to a first power supply terminal;

the third and fourth current mirrors are coupled to a second power supply terminal; and substantially all current that flows between the first and second power supply terminals through the driver also flows between the first and second output terminals through the load.

29. The method of claim 26, wherein:

the first switch is a first transistor with a control terminal coupled to the first input terminal, an output terminal coupled to a first diode-connected transistor and the first current mirror, and another output terminal coupled to a node;

the second switch is a second transistor with a control terminal coupled to the second input terminal, an output terminal coupled to a second diode-connected transistor and the second current mirror, and another output terminal coupled to the node;

the third switch is a third transistor with a control terminal coupled to the first input terminal, an output terminal coupled to a third diode-connected transistor and the third current mirror, and another output terminal coupled to the node; and the fourth switch is a fourth transistor with a control terminal coupled to the second input terminal, an output terminal coupled to a fourth diode-connected transistor and the fourth current mirror, and another output terminal coupled to the node.

30. The method of claim 26, further comprising the steps of:

initiating the differential input signal using a computer system; and using the driver to generate the first and second output currents in response to the differential input signal.

31. A method of providing a computer system, comprising the steps of:

providing a driver, the provided driver including:

first and second input terminals for receiving first and second input voltages, respectively, of a differential input signal;

first and second switches coupled to the first and second input terminals, respectively;

third and fourth switches coupled to the first and second input terminals, respectively;

first, second, third and fourth current references coupled to the first, second, third and fourth switches, respectively;

first, second, third and fourth current mirrors coupled to the first, second, third and fourth current references, respectively; and first and second output terminals, the first output terminal coupled to the first and third current mirrors, the second output terminal coupled to the second and fourth current mirrors.

32. The method of claim 31, wherein:

the first and second current references and the first and second current mirrors are coupled to a first power supply terminal; and the third and fourth current references and the third and fourth current mirrors are coupled to a second power supply terminal.

33. The method of claim 31, wherein the first, second, third and fourth switches include output terminals coupled to a single node.

34. The method of claim 31, further comprising the steps of:

providing a first bias circuit to establish a first bias current between the first and fourth current references when the first and fourth switches are open and the second and third switches are closed; and providing a second bias circuit to establish a second bias current between the second and third current references when the second and third switches are open and the first and fourth switches are closed.

35. The method of claim 31, further comprising the step of providing an integrated circuit chip that includes the driver.

* * * * *